United States Patent
Cha et al.

(10) Patent No.: US 10,410,917 B2
(45) Date of Patent: Sep. 10, 2019

(54) SEMICONDUCTOR DEVICE INCLUDING STANDARD CELL AND ELECTRONIC DESIGN AUTOMATION METHOD THEREOF

(71) Applicant: SAMSUNG ELECTRONICS CO., LTD., Suwon-si, Gyeonggi-Do (KR)

(72) Inventors: Young-San Cha, Hwaseong-si (KR); Dongkyu Youn, Ansan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 255 days.

(21) Appl. No.: 15/425,593

(22) Filed: Feb. 6, 2017

(65) Prior Publication Data

US 2017/0256446 A1    Sep. 7, 2017

(30) Foreign Application Priority Data

Mar. 3, 2016 (KR) .................. 10-2016-0025809

(51) Int. Cl.
*G06F 17/50* (2006.01)
*H01L 21/768* (2006.01)
*H01L 23/528* (2006.01)

(52) U.S. Cl.
CPC .... *H01L 21/76838* (2013.01); *G06F 17/5072* (2013.01); *G06F 17/5077* (2013.01); *H01L 23/5283* (2013.01)

(58) Field of Classification Search
CPC ............. G06F 17/5045; G06F 17/5068; G06F 17/5072; G06F 17/5077; H01L 27/0207
USPC ......................................... 716/110, 126, 139
See application file for complete search history.

(56) References Cited

U.S. PATENT DOCUMENTS

| | | | |
|---|---|---|---|
| 7,503,026 B2 | 3/2009 | Ichiryu et al. | |
| 7,681,162 B2 | 3/2010 | Tanaka | |
| 7,685,540 B1 | 3/2010 | Madden et al. | |
| 8,174,052 B2 | 5/2012 | Kim et al. | |
| 8,788,998 B2 | 7/2014 | Hatamian et al. | |
| 2012/0286858 A1 | 11/2012 | Biggs et al. | |
| 2013/0042216 A1 | 2/2013 | Loh et al. | |
| 2013/0214433 A1 | 8/2013 | Penzes | |
| 2013/0131615 A1 | 11/2013 | Tzeng et al. | |
| 2014/0091367 A1* | 4/2014 | Wagner ............... | G06F 17/5068 257/207 |
| 2014/0327050 A1 | 11/2014 | Hsieh et al. | |
| 2015/0286768 A1 | 10/2015 | Macdonald et al. | |

(Continued)

FOREIGN PATENT DOCUMENTS

| | | |
|---|---|---|
| JP | 2007-043049 A | 2/2007 |
| JP | 2007-180061 A | 7/2007 |
| KR | 20090091913 A | 8/2009 |

*Primary Examiner* — Paul Dinh
(74) *Attorney, Agent, or Firm* — Volentine, Whitt & Francos, PLLC

(57) ABSTRACT

An electronic design automation method configured to automatically design a semiconductor device includes generating a site-row having a unit height based on a standard cell having the unit height, and generating metal routing tracks which begin at an offset point spaced a specific distance from an origin point of the site-row. The unit height is a non-integer multiple of a spacing of metal lines of one of interconnection layers of the semiconductor device. Using this process, a layout of a plurality of standard cells on a plurality of site-rows, and constituting a Floorplan of the semiconductor device, is generated.

6 Claims, 13 Drawing Sheets

(56) References Cited

U.S. PATENT DOCUMENTS

2017/0177785 A1* 6/2017 Lowe ................... G06F 17/5045
2018/0018419 A1* 1/2018 Rowhani ............. G06F 17/5072
2018/0211947 A1* 7/2018 Chu .................... H01L 27/0207

* cited by examiner

SEMICONDUCTOR DEVICE INCLUDING STANDARD CELL AND ELECTRONIC DESIGN AUTOMATION METHOD THEREOF

PRIORITY STATEMENT

This U.S. non-provisional patent application claims priority under 35 U.S.C. § 119 of Korean Patent Application No. 10-2016-0025809, filed on Mar. 3, 2016, the entire contents of which are hereby incorporated by reference.

BACKGROUND

The inventive concept relates to electronic design automation of a semiconductor device. More particularly, the inventive concept relates to a semiconductor device including standard cells and to electronic design automation thereof.

As the integration of semiconductor devices increases and the circuit configurations of semiconductor become more complicated, it is very difficult to design a layout of a semiconductor device manually. Thus, a semi-custom method of designing a layout of a semiconductor device using a computer is generally used. The semi-custom method is to provide a cell library in a design tool, produce a set of standard cells in advance using the cell library, and then layout using such standard cells. Such standard cells are generally each given a rectangular shape or footprint in the layout. Therefore, in the layout, i.e., as viewed in plan, each standard cell has two dimensions which will be referred to as a width and a height. The height is generally uniform among the standard cells and referred to as a unit height.

The standard cells represent components which can execute a logic function of the semiconductor device. That is, in a semi-custom method, various types of standard cells are generated and a semiconductor device is designed using such standard cells. To automatically design a semiconductor device, a site-row in which standard cells are disposed is generated and has a site row height corresponding to the unit height of standard cells. The unit height of the standard cells is determined basically by a size of an NMOS/PMOS included in (represented by one of the standard cells) and a minimum process design rule used when the set of standard cells for the device layout is generated. However, the unit height of the standard cells is designed to accommodate a whole number multiple of a basic spacing of metal lines (interval between adjacent ones of the metal lines) according to a standardized Floorplan rule supported by an electronic design automation (EDA) tool. Thus, the unit height of the standard cells has an additional overhead.

SUMMARY

Examples of the inventive concept include an electronic design automation method of automatically designing a semiconductor device, and which comprises generating a site-row having a unit height based on a standard cell having the unit height, and overlaying metal routing tracks on the site-row, the metal routing tracks beginning at a location offset a specified distance from an origin point of the site-row, wherein the unit height is a non-integer multiple of a spacing of metal lines of one of interconnection layers of the semiconductor device, and a layout of the semiconductor device, based on the site-row and the standard cell, is generated. The layout includes a plurality of site rows and a plurality of standard cells laid out in the plurality of site-rows.

Examples of the inventive concept also include an electronic design automation method of automatically designing a semiconductor device, and which comprises generating standard cells each having a unit height, using a layout tool, generating site-rows each having the unit height and generating metal routing tracks for each of the site-rows and which begin at an offset point spaced a specific distance from an origin point of the site-row, using an electronic design automation (EDA) tool, and laying out the standard cells on the site-rows and laying out metal lines of interconnection layers of the semiconductor device and points of connection between the metal lines and the standard cells, using a P&R (place and route) tool, wherein the metal lines of one of the interconnection layers and points of connection thereof with the standard cells are laid out along the metal routing tracks, and the unit height is a non-integer multiple of a spacing of the metal lines of one of interconnection layers.

Examples of the inventive concept also include a method of manufacturing a semiconductor device, and which comprises an electronic automated design process of generating a layout of the semiconductor device and a semiconductor device fabrication process of fabricating a semiconductor device conforming to the layout, wherein the automated design process includes producing a set of standard cells each being a two-dimensional representation of an electronic component of the semiconductor device, and wherein one of the two dimensions of each of the standard cells is standardized so that said one of the dimensions has the same value among the standard cells, producing site-rows disposed side-by-side and collectively corresponding to a footprint of the semiconductor device, each of the site-rows comprising a two-dimensional frame, one of the dimensions of the frame being a width of the frame and the other of the dimensions being the same as the standardized dimension of the unit cells, generating an overlay of metal routing tracks for each of the site-rows and which, for each of the site rows, begin at a point offset from an origin located along a width-wise side of the frame of the site-row, and laying out the standard cells in the site-rows each as confined within the frame of a respective one of the site-rows with standardized dimension of each of the standard cells oriented in a first direction parallel to the standardized dimensions of the frames of the site-rows. The semiconductor device conforming to the layout is fabricated by forming the electronic components represented by the standard cells on a substrate, forming interconnection layers of metal lines one above another on the substrate, and connecting the metal lines to the electronic components. The metal lines of one of the interconnection layers extend parallel and linearly along tracks corresponding to respective ones of the metal routing tracks, the metal lines of said one of the interconnection layers have a substantially uniform line-to-line spacing, and the standardized dimension is not equal to the product of any integer and said line-to-line spacing.

BRIEF DESCRIPTION OF THE DRAWINGS

The inventive concept will be described below in more detail with reference to examples thereof as illustrated in the accompanying drawings. The inventive concept may, however, be exemplified in different forms and should not be construed as limited to the examples set forth herein. Rather, these examples are provided so that this disclosure will be thorough and complete, and will fully convey the scope of the inventive concept to those skilled in the art. Like numbers refer to like elements throughout.

DETAILED DESCRIPTION

Below, examples of inventive concept will now be described more fully so that those skilled in the art can easily comprehend the inventive concept. Before the description proceeds, however, it is to be noted that terms such as "generating", "overlaying", "laying out", etc. in connection with a design method may be understood as referring to in a virtual sense as represented by electronic data or information and/or in a real sense as represented by a display on a monitor, for example.

Figure 1:
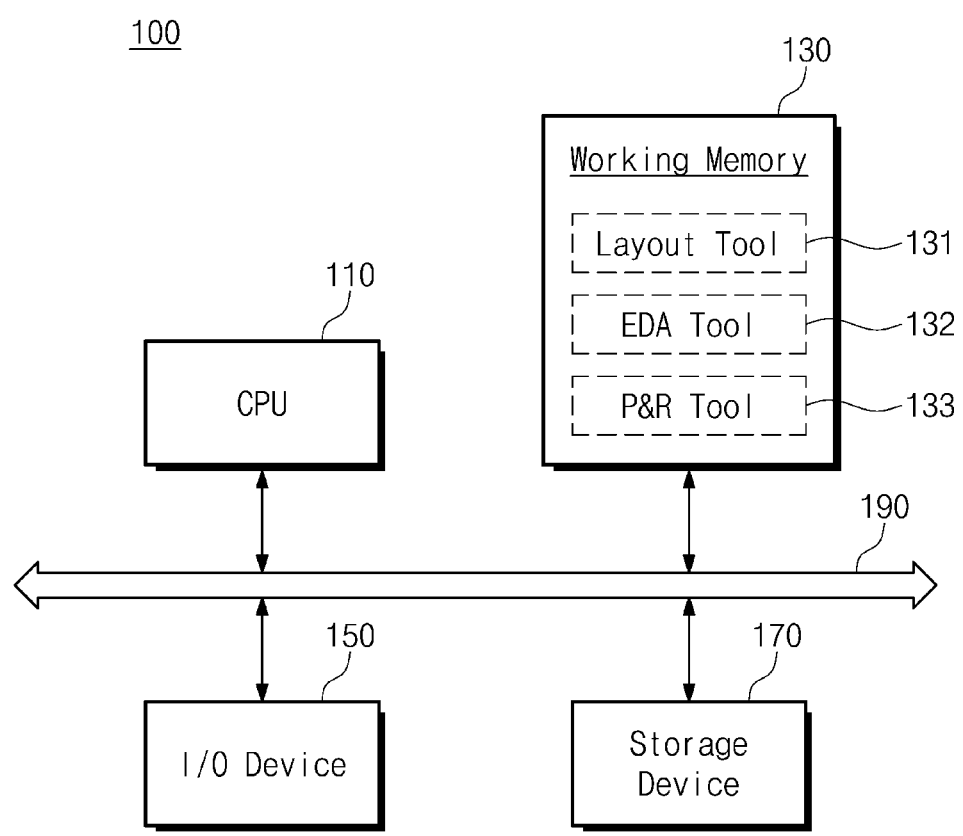
FIG. 1 is a block diagram illustrating an electronic design automation system which may be configured in accordance with the inventive concept.

FIG. 1 is a block diagram illustrating an electronic design automation system. Referring to FIG. 1, the electronic design automation system 100 includes a central processing unit (CPU) 110, a working memory 130, an input/output (I/O) device 150, a storage device 170, and a system bus 190. The electronic design automation system 100 may be provided as a device dedicated for designing a semiconductor device. The electronic design automation system 100 may also be part of a computer system for driving various design tools or layout tools.

The CPU 110 executes software (e.g., an application program, an operating system, device drivers) in the electronic design automation system 100. The CPU 110 executes an operating system (OS) (not shown) loaded into the working memory 130. The CPU 110 executes various application programs or design tools to be driven based on an operating system (OS). For example, the CPU 110 can drive semiconductor device design tools loaded in the working memory 130. Design tools of the inventive concept, which may be may be loaded in the working memory 130 and driven by the CPU 110, may include a layout tool 131, an EDA (electronic design automation) tool 132, and a P&R (place and route) tool 133.

When the electronic design automation system 100 is booted, an OS image (not shown) stored in the storage device 170 may be loaded into the working memory 130 on the basis of a booting sequence. All the input/output operations of the electronic design automation system 100 may be supported by the operating system (OS). Similarly, application programs to be selected by a user or to provide a basic service may be loaded in the working memory 130.

The layout tool 131, the EDA (electronic design automation) tool 132, and the P&R (place and route) tool 133 may be loaded from the storage device 170 into the working memory 130. The working memory 130 may be a volatile memory such as a SRAM (static random access memory), a DRAM (dynamic random access memory), etc. or a non-volatile memory such as a PRAM, a MRAM, a ReRAM, a FRAM, a NOR flash memory, etc.

The layout tool 131 may store a library of standard cells or may receive a library of the standard cells from the outside. The layout tool 131 may provide various types of standard cells, in the automated design process, using the standard cell library. The standard cells may all have the same unit height. The standard cells may have different cell widths depending on their types. The layout tool 131 may use information of metal lines of the device (whose design will be discussed below in connection with the P&R tool 133). The unit height of the standard cell may be calculated by the layout tool 131 to be some factor of the spacing, i.e., the distance between adjacent ones, of the metal lines.

The EDA tool 132 may design a Floorplan according a Floorplan rule using information of standard cells generated by the layout tool 131. For example, the designing of the Floorplan includes generating a layout of site-rows and metal routing tracks on the generated site-rows. The site-rows may have the same size as one another and may be disposed adjacent to one another (side-by-side). Each site-row is a frame accommodating a group of standard cells in an automatically designed semiconductor device. The metal routing tracks are a virtual course along which metal lines are laid out by the P&R tool 133. The metal lines connect the standard cells to each other The P&R tool 133 may lay out the standard cells in the site-rows and may lay out metal lines along the metal routing tracks. For example, the P&R tool 133 may place the standard cells in the Floorplan based on generated information of the semiconductor device. The P&R tool 133 may design the metal lines using a netlist of the semiconductor device.

The input/output (I/O) device 150 controls a user input or a user output from user interface devices. For example, the input/output (I/O) device 150 may include an input device such as a keyboard, a mouse, and a touchpad to receive a netlist of the semiconductor device or configuration information of various types of standard cells. The input/output (I/O) device 150 may include an output device such as a monitor to display progress in generating the layout and a result of a design operation of the electronic design automation system 100.

The storage device 170 is provided as storage medium of the electronic design automation system 100. The storage device 170 may store application programs, operating system images and all kinds of data. The storage device 170 may be provided in the form of a memory card (MMC, eMMC, SD, MicroSD, etc.) or a hard disk drive (HDD). The storage device 170 may include a NAND type flash memory having large storage capacity. The storage device 170 may include a next generation nonvolatile memory such as a PRAM, a MRAM, a ReRAM, a FRAM, etc. or a NOR type flash memory.

The system bus 190 may be provided as an interconnector for providing a network inside the electronic design automation system 100. The CPU 110, the working memory 130, the input/output (I/O) device 150, and the storage device 170 may be electrically connected to one another through the system bus 190 and exchange data with one another. However, the constitution of the system bus 190 is not limited and may further include an arbitration means for effective management of data transmissions.

The electronic design automation system 100 is configured in accordance with the inventive concept to generate standard cells having a unit height that is a non-integer multiple of a space between metal lines whose layout is generated by the P&R tool 133. Here, the term "non-integer multiple" of the space between the metal lines refers to a value that is not a product of any natural number and the spacing between adjacent ones of the metal lines, which may also be referred to as the pitch of the metal lines. The electronic design automation system 100 may generate site-rows having a unit height that is a non-integer multiple of a space between metal lines whose layout is generated by the P&R tool 133, based on such standard cells. Thus, the electronic design automation system 100 may generate a site-row having a smaller area than the site-row having a unit height that is an integer multiple of a space (product of a natural number and the spacing) between metal lines whose layout is generated by the P&R tool 133. That is, the electronic design automation system 100 according to the inventive concept can design a relatively highly integrated semiconductor device. This will be more apparent from the descriptions that follow by comparing an example described below with reference to FIGS. 3-5 with the inventive concept, examples of which are described with reference to FIGS. 6-12.

Figure 2:
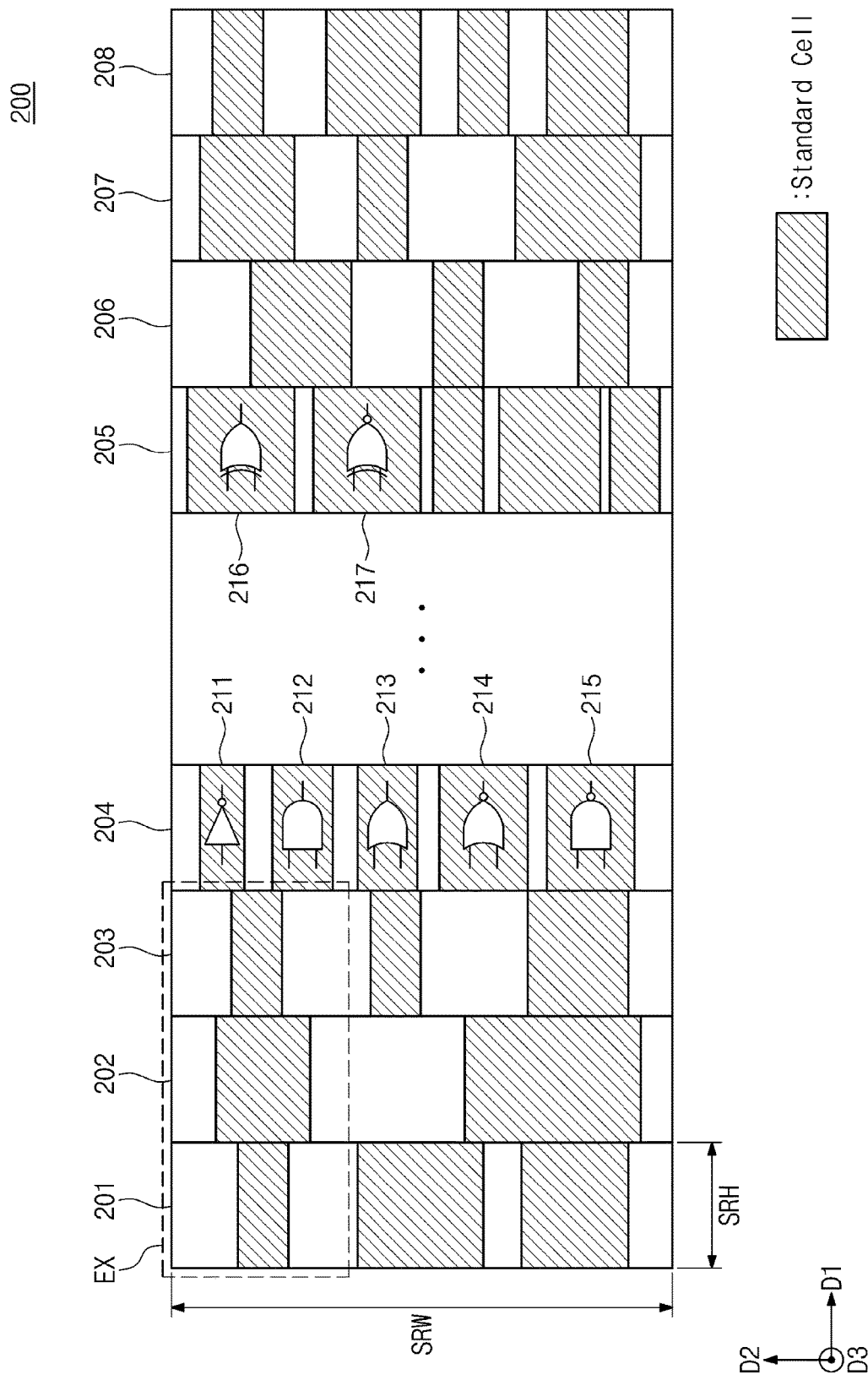
FIG. 2 is a schematic or Floorplan of a semiconductor device, which may be generated by the electronic design automation system of FIG. 1.

First, however, an example of a semiconductor device generated by the electronic design automation system of FIG. 1 will be described in more detail with reference to FIG. 1 and the schematic diagram of such an example as shown in FIG. 2. Referring to FIGS. 1 and 2, a semiconductor device 200 may include a plurality of site-rows 201~208 and a plurality of components represented by standard cells 211~217. The site-row is a frame in which the standard cells are laid out in the schematic of the automatically designed semiconductor device 200.

In FIG. 2, the rectangles which are cross-hatched are the standard cells. The numbers of transistors of the various types of standard cells differ from one another and so, the standard cells 211~217 may have different functions from one another. For example, the standard cell 211 performs a function of an inverter in the semiconductor device 200. The standard cell 212 performs an AND function. The standard cell 213 performs an OR function. The standard cell 214 performs a function of a NOR gate. The standard cell 215 performs a function of a NAND gate. The standard cell 216 performs a function of an XOR gate. The standard cell 217 performs a function of an XNOR gate. Standard cells that perform other functions of various logical circuits may be generated. In any case, various types of standard cells may be combined with one another to constitute a functional circuit or functional block EX of the Floorplan.

Note, the standard cells 211~217 all have the same unit height.

A site-row may be generated by the EDA tool 132. Each of the site-rows 201~208 may have a site-row height (SRH) in a first direction D1 and may have a site-row width (SRW) in a second direction D2. For example, the site-row height (SRH) may be a unit height which is the same as that of each standard cell. The site-row width (SRW) may vary according to a function of the semiconductor device 200. The site-rows 201~208 may be generated in sequence from the site-row 201 to the site-row 208 along the first direction D1. The number of site-rows 201~208 is determined according to a function of the semiconductor device 200.

Standard cells may be laid out in the site-rows 201~208 by the P&R tool 133 according to a circuit configuration of the semiconductor device 200. For example, the P&R tool 133 may dispose the standard cells in the site-rows 201~208 and design interconnections of the standard cells. More specifically, and although not shown in FIG. 2, the standard cells may be connected to one another by metal lines. The metal lines may be included in a plurality of layers. The layers may be stacked in a third direction D3. Metal lines of each layer may run in a direction perpendicular to metal lines of each layer adjacent thereto. For example, when metal lines of the lowermost first layer run in the first direction D1, metal lines of a second layer adjacent to the first layer may run in the second direction D2.

A unit height of the standard cell or the site-row may be determined based on the spacing of metal lines of the second layer running in the second direction D2. That is, the metal lines that determine the unit height of the standard cell or the site-row may be the metal lines of the second layer running in the second direction D2.

Figure 3:
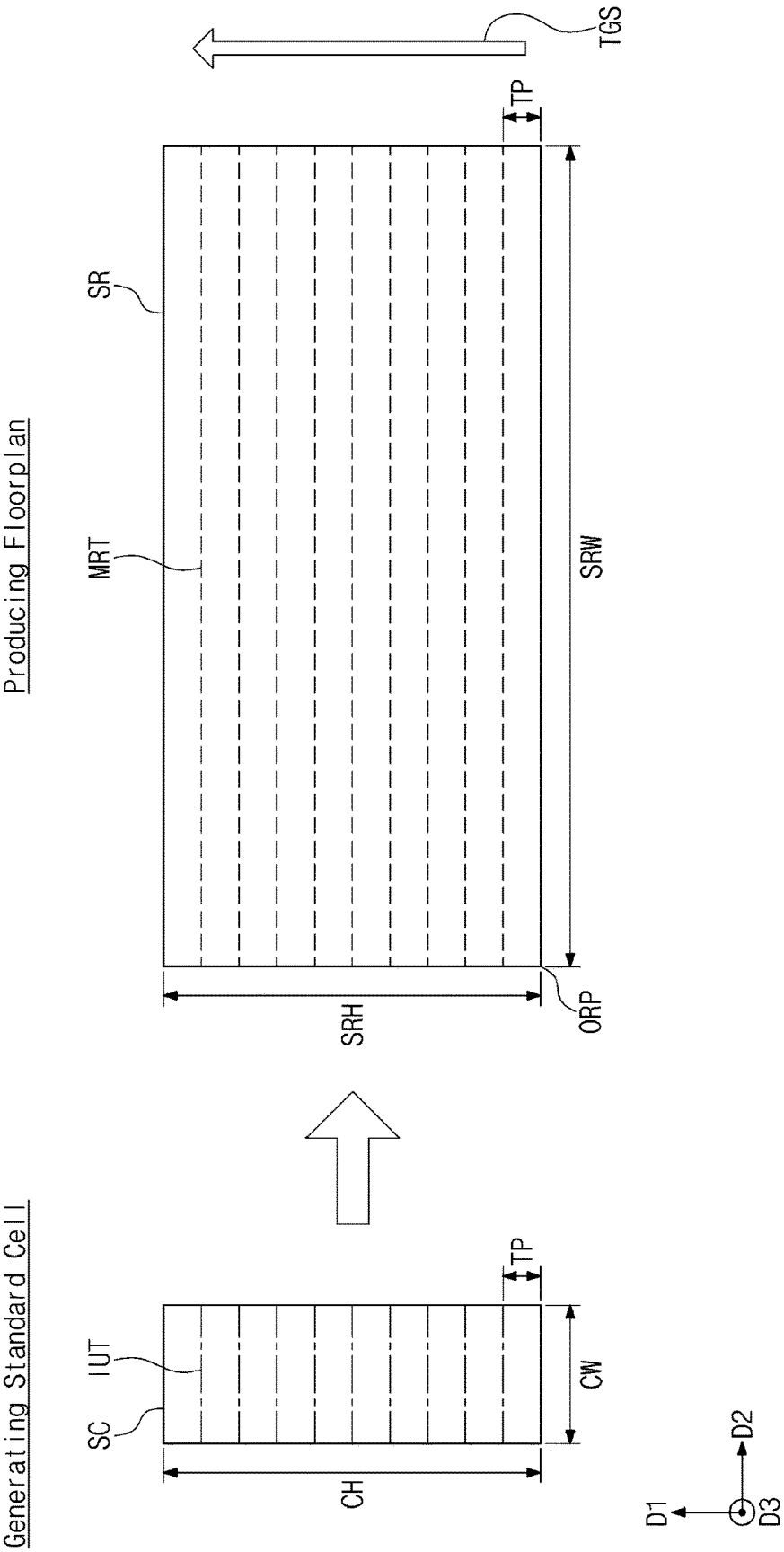
FIG. 3 is a conceptual diagram illustrating a general method of generating a standard cell and a site-row.

FIG. 3 illustrates a general method of generating a standard cell and a site-row. Referring to FIGS. 1 and 3, the electronic design automation system 100 may generate a set of standard cells using the layout tool 131. In particular, the layout tool 131 may generate a set of standard cells (SC) each having a cell height (CH) in a first direction D1 and a cell width (CW) in a second direction D2. All of the standard cells may have a unit height which is the same as the cell height (CH). However, the standard cells may have various cell widths (CW) each depending on its type.

The electronic design automation system 100 may generate a Floorplan using the EDA tool 132. The EDA tool 132 may generate the Floorplan based on the sizes of the standard cells (SC). In particular, the EDA tool 132 may design the site-rows (SR) and metal routing tracks (MRT) for the site rows. The metal routing tracks (MRT) are virtual lines along which metal lines of the semiconductor device and laid out by the P&R tool 133 are to run to connect standard cells (SC) in a site row.

In a conventional method, the layout tool 131 is configured to generate a standard cell (SC) having a unit height that is an integer multiple of the spacing of metal lines to be formed along the MRT in the second direction D2 as designed by the P&R tool 133. That is, the cell height (CH) is an integer multiple of the space between adjacent ones of the metal lines. The layout tool 131 may form internal unit tracks (IUT) in the standard cell (SC) at a track pitch (TP) corresponding to the spacing of the metal lines. Each internal unit track (IUT) is a virtual line corresponding to a metal routing track (MRT) of a site-row (SR). Contact points of transistors of the standard cell (SC) exist on the internal unit tracks (IUT).

The EDA tool 132 may generate a site-row (SR) based on the unit height of the standard cell (SC). That is, a site-row height (SRH) may be the unit height. The EDA tool 132 may generate metal routing tracks (MRT) at a track pitch (TP) from an origin point (ORP) in the direction of arrow TGS.

However, the unit height of the standard cell (SC) may be designed as an integer multiple of the space between the metal lines according to a standardized Floorplan rule of the EDA tool 132 regardless of the size of an NMOS/PMOS of the standard cell. Thus, the site-row (SR) is also designed to have a unit height equal to an integer multiple of the space between the metal lines. Accordingly, each site row designed in this way may include a surplus area or overabundance of space that is essentially unoccupied and therefore, unnecessary in the semiconductor device.

Figure 4:
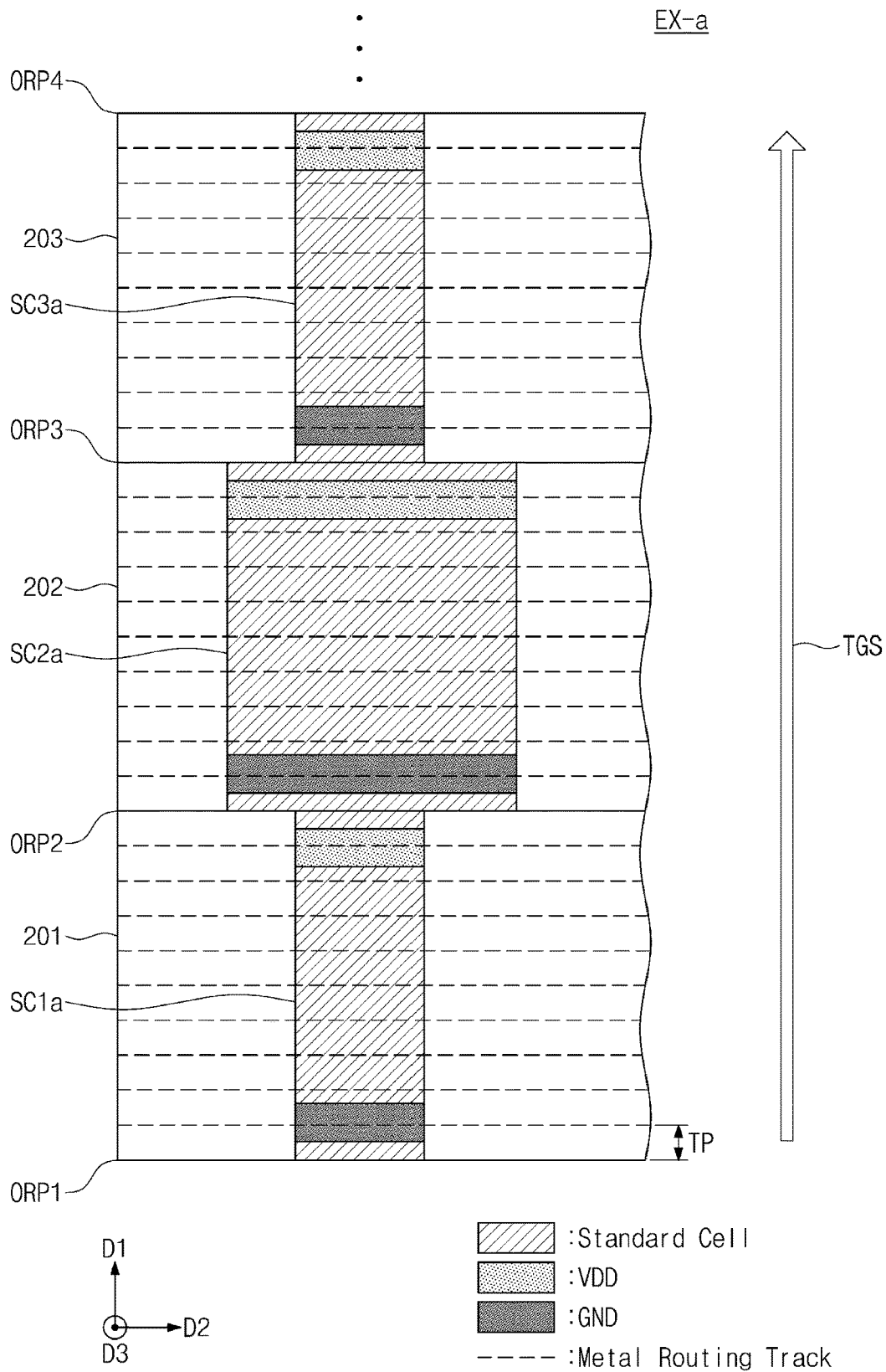
FIG. 4 is a schematic of part of a semiconductor device generated according to the method of FIG. 3.

FIG. 4 shows a part (EX-a) of the semiconductor device 200 of FIG. 2 designed according to the method of FIG. 3. The part (EX-a) of the semiconductor device 200 includes standard cells (SC1*a*, SC2*a*, SC3*a*) in site-rows 201, 202 and 203 that are generated by the method of FIG. 3. The standard cells (SC1*a*, SC2*a*, SC3*a*) are disposed on the site-rows 201, 202 and 203, respectively. The site-rows 201, 202 and 203 are overlaid with metal routing tracks. The metal routing tracks have a track pitch (TP) corresponding to a spacing of metal lines that will run in a second direction D2 in the device.

Each of the standard cells (SC1*a*, SC2*a*, SC3*a*) may include a power supply terminal VDD and a ground terminal GND (contact points). The power supply terminal VDD and the ground terminal GND are each are overlapped by at least one metal routing track.

Here is illustrated a conventional case in which the unit height of the standard cells (SC1*a*, SC2*a*, SC3*a*) is provided as an integer multiple of the space between the metal lines according to a standardized Floorplan rule of the EDA tool 132. Thus, the standard cells (SC1*a*, SC2*a*, SC3*a*) and hence, the site-rows 201, 202 and 203 include an unnecessary area.

Figure 5:
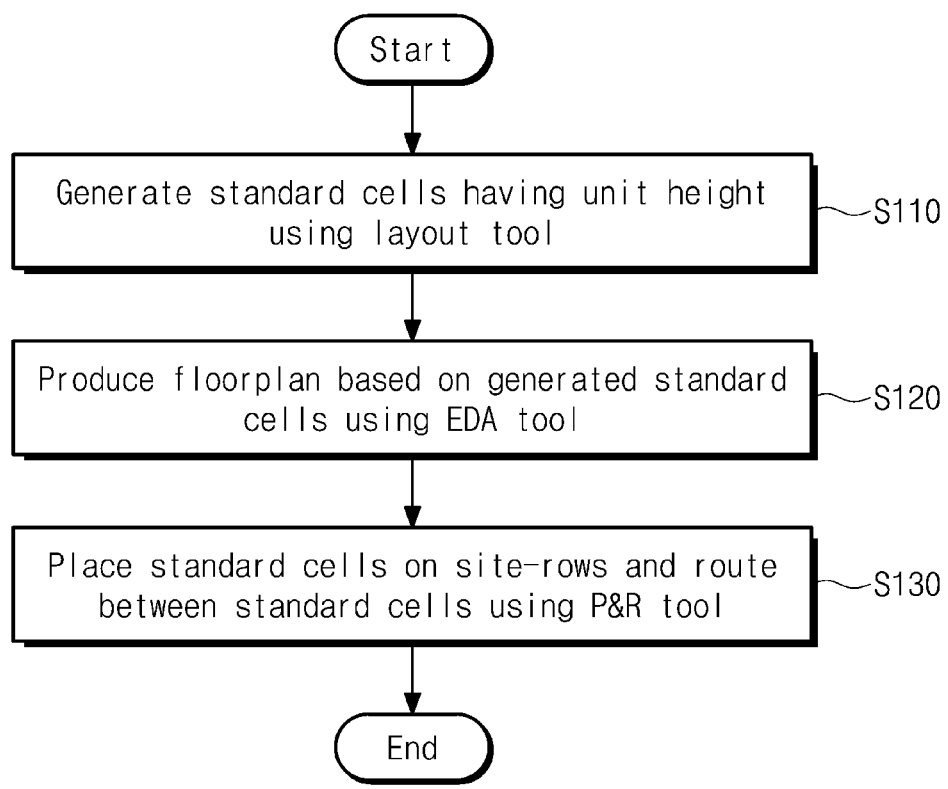
FIG. 5 is a flowchart illustrating a general electronic design automation method.

FIG. 5 is a flowchart illustrating a general electronic design automation method. Referring to FIG. 5, the semiconductor device 200 is designed of standard cells having a unit height that is an integer multiple of a space between metal lines.

In carrying out the method of FIG. 5, the electronic design automation system 100 generates a set of standard cells each having a unit height using the layout tool 131 (S110). For example, the unit height may be one dimension (the length) of a standard cell calculated as an integer multiple of the space between adjacent ones of the metal lines.

The electronic design automation system 100 may provide a Floorplan based on the standard cells generated by the EDA tool 132 (S120). For example, the EDA tool 132 may generate site-rows for the Floorplan and overlay metal routing tracks on the site-rows. A height of each site-row is the same as the unit height of the standard cell generated in the operation S110. The pitch of the metal routing tracks is the same as the space between adjacent ones of the metal lines.

The electronic design automation system 100 may lay out the standard cells on the site-rows and generate a layout of the metal lines connecting the standard cells using the P&R tool 133 (S130). For example, the standard cells may be laid out in the site-rows according to a function of the semiconductor device 200. The P&R tool 133 may lay out the metal lines, connecting the standard cells in a site-row, along the metal routing tracks.

Figure 6:
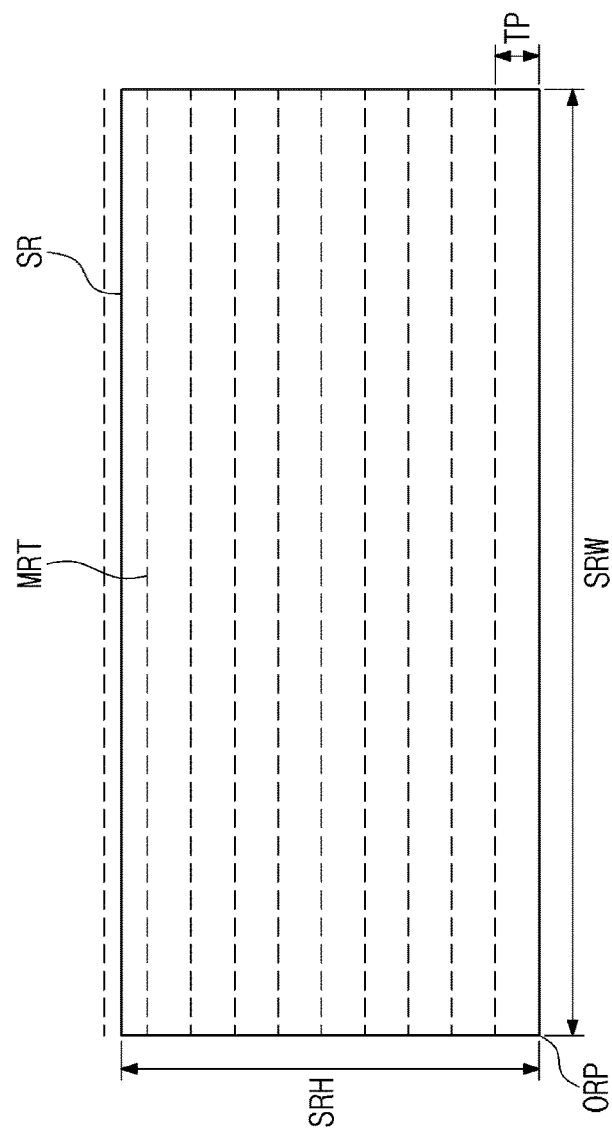
FIG. 6 is a conceptual diagram illustrating a method of generating a standard cell and a site-row according to the inventive concept.

FIG. 6 illustrates a standard cell and a site-row generated according to an example of the inventive concept. Referring to FIGS. 1 and 6, the electronic design automation system 100 may generate a standard cell (SC) using the layout tool 131. The electronic design automation system 100 may provide a Floorplan using the EDA tool 132.

More specifically, the layout tool 131 may generate a two-dimensional standard cell (SC) having a cell height (CH) in a first direction D1 and a cell width (CW) in a second direction D2. All of the standard cells have a dimension or unit height equal to the cell height (CH). The unit height of each standard cell (SC) may thus be referred to as a standardized dimension. On the other hand, the other dimension of each standard cell, i.e., the cell width (CW), may have any of various values depending on the type of component represented by the standard cell.

The layout tool 131, configured according to the inventive concept, generates a standard cell (SC) having a unit height that is a non-integer multiple of a space between metal lines running in the second direction D2 as designed by the P&R tool 133. That is, the cell height (CH) is not equal to a product of any integer times the space between the metal lines. For example, comparing a standard cell (SC) in the example of FIG. 6 to a standard cell (SC) representing the same type of component in the example of FIG. 3, if the unit height of the standard cell (SC) of FIG. 3 is a multiple of 10 (an integer) times the spacing (TP) of the metal routing tracks MRT, the unit height of the standard cell (SC) may be equal to 9 times the same spacing (TP) of the metal lines plus only a fractional amount of the spacing (TP). Such a fractional amount may be represented as n/TP wherein 0<n<TP. Thus, the standard cell of FIG. 6 may be smaller than the standard cell of FIG. 3.

The EDA tool 132 may generate a site-row (SR) based on the unit height of the standard cell (SC). That is, the two-dimensional frame of the site-row may have one dimension equal to the standardized dimension. Therefore, the site-row of FIG. 6 may also be smaller than the site-row of FIG. 3. Thus, the electronic design automation system 100 configured according to the inventive concept may design a semiconductor device having a relatively small area or footprint.

Figure 7:
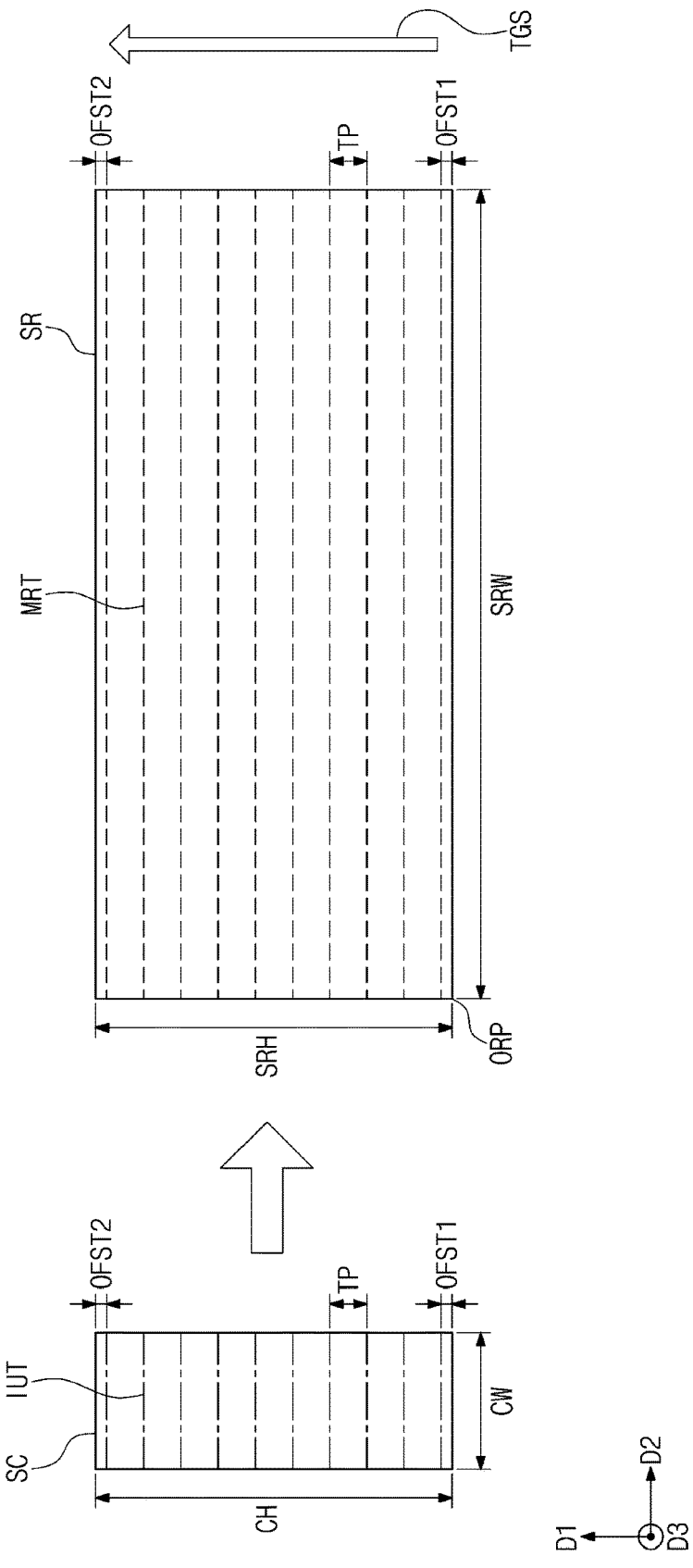
FIG. 7 is a conceptual diagram illustrating a method of generating a standard cell and a site-row in accordance with the inventive concept.

FIG. 7 illustrates another example of a method of generating a standard cell and a site-row in accordance with the inventive concept. Referring to FIGS. 1 and 7, the electronic design automation system 100 may generate a set of standard cells (SC) using the layout tool 131. The electronic design automation system 100 may provide a Floorplan using the EDA tool 132. A size of the standard cell of FIG. 7 is the same as the size of the standard cell of FIG. 6.

As shown by FIG. 7, the layout tool 131 may generate a standard cell (SC) having a cell height (CH) in a first direction D1 and a cell width (CW) in a second direction D2. For example, the cell height (CH) of the standard cell (SC) may be a unit height of a non-integer multiple of the space between the metal lines. However, each standard cell may have various cell widths (CW) depending on its type.

The layout tool 131 may generate a standard cell (SC) to have a unit height that is a non-integer multiple of a space between metal lines to be laid out as running in the second direction D2 by the P&R tool 133. That is, the cell height (CH) or unit height are equal to a non-integer multiple of the space between the metal lines. Thus, the area of the standard cell of FIG. 7 may be smaller than the area of the corresponding standard cell of FIG. 3.

The layout tool 131 may lay out internal unit tracks (IUT) in the standard cell (SC) at a track pitch (TP) corresponding to a space between metal lines. The layout tool 131 may lay out the internal unit tracks (IUT) to be offset by given amounts OFST1 and OFST2 from both ends of the standard cell (SC) along the first direction D1. The offsets OFST1 and OFST2 may have different values from each other or may have the same value as each other. The internal unit tracks (IUT) are virtual lines corresponding to the metal routing tracks of a site-row (SR). Contact points of transistors of the standard cell (SC) exist on the internal unit tracks (IUT).

The EDA tool 132 may generate a site-row (SR) based on the unit height of the standard cell (SC). That is, a site-row height (SRH) may equal the unit height. Starting at a location spaced the first offset OFST1 apart from an origin point (ORP), the EDA tool 132 may generate a metal routing track (MRT) to have a track pitch (TP) in an arrow direction TGS.

Thus, the electronic design automation system 100 configured according to the inventive concept may design a semiconductor device having a relatively small area or footprint.

Figure 8:
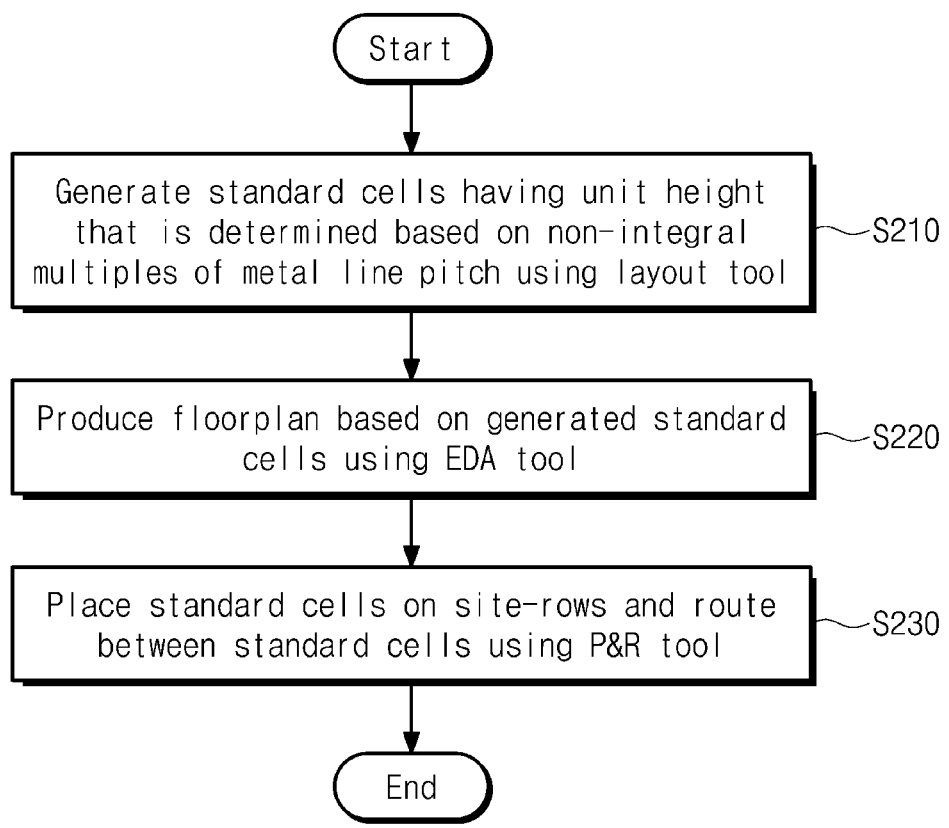
FIG. 8 is a flowchart illustrating an electronic design automation method in accordance with the inventive concept.

FIG. 8 is a flowchart illustrating examples of an electronic design automation method in accordance with the inventive concept. Referring to FIG. 8, the semiconductor device 200 is designed based on a unit height that is a non-integer multiple of a space between metal lines.

The electronic design automation system 100 may generate standard cells having a unit height (or "standardized dimension") using the layout tool 131 (S210). For example, the unit height may be equal to a non-integer multiple of a space between metal lines of the device.

The electronic design automation system 100 may provide a Floorplan based on the standard cells generated by the EDA tool 132 (S220). For example, the EDA tool 132 may generate site-rows of the Floorplan and an overlay of metal routing tracks on the site-rows. A height (one dimension of the frame) of each site-row is the same as the unit height (standardized dimension) of the standard cells generated in the operation S210. Thus, the height of each site-row may be equal to a non-integer multiple of the space between the metal lines.

The electronic design automation system 100 may arrange the standard cells on the site-rows by the P&R tool 133 and set the points of connection between metal lines and the standard cells (S230). In particular, each standard cell is set within the frame of a respective site-row, and the standard cells may be arranged on the site-rows according to a function of the semiconductor device 200. The P&R tool 133 may also set the points of connection of between the metal lines and the standard cells along the metal routing tracks.

Figure 9:
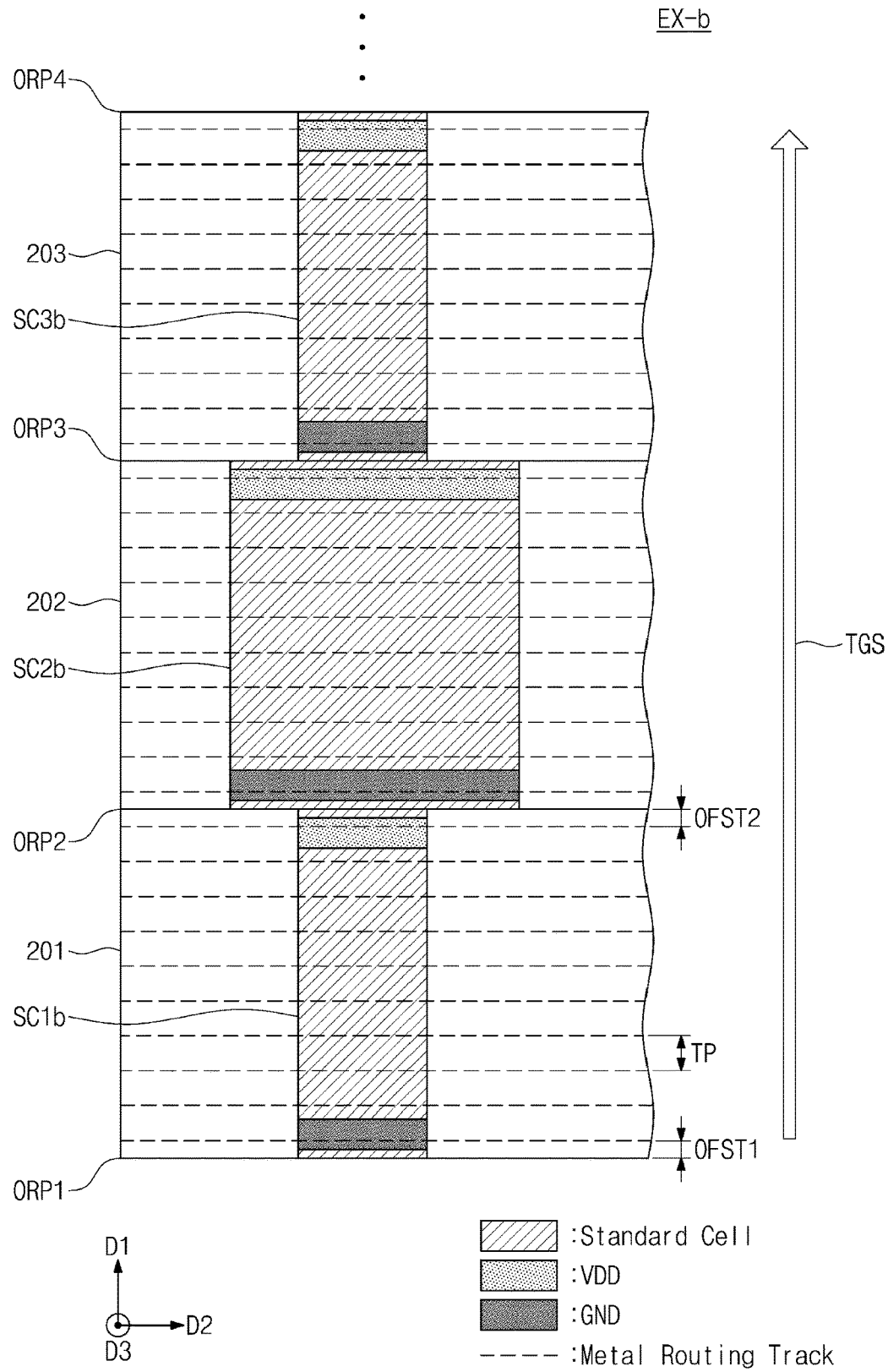
FIG. 9 is an example of a schematic of a semiconductor device generated according to the electronic design automation method of FIG. 8.

FIG. 9 is a drawing illustrating an example of part (EX-b) of a semiconductor device designed according to the electronic design automation method of FIG. 8. The part (EX-b) shown in FIG. 9 corresponds to the part or functional block (EX) of the semiconductor device 200 of FIG. 2. The part (EX-b) of the semiconductor device 200 includes standard cells (SC1b, SC2b, SC3b) and site-rows 201, 202 and 203. The standard cells (SC1b, SC2b, SC3b) may be disposed on the site-rows 201, 202 and 203, respectively. Starting at a location spaced a first offset OFST1 apart from respective origin points (ORP1, ORP2, ORP3) of the site-rows 201, 202 and 203, metal routing tracks are laid out in the site-rows. The metal routing tracks may have a track pitch (TP) corresponding to a space between metal lines running in a second direction D2 in the device.

Each of the standard cells (SC1b, SC2b, SC3b) may include a power supply terminal VDD and a ground terminal GND. The power supply terminal VDD and the ground terminal GND are laid out to overlap at least one metal routing track each.

A unit height of the standard cells (SC1b, SC2b, SC3b) may be equal to a non-integer multiple of a space between the metal lines according to a size of an NMOS/PMOS included in the standard cell and a minimum process design rule. Thus, the electronic design automation system 100 may establish the unit height of the standard cells (SC1b, SC2b, SC3b) as equal to a non-integer multiple of the space between the metal lines. An area of the standard cells (SC1b, SC2b, SC3b) and an area of the site-rows 201, 201 and 203 of FIG. 9 may be smaller than the area of the standard cells (SC1b, SC2b, SC3b) and the area of the site-rows 201, 201 and 203 of FIG. 4.

Figure 10:
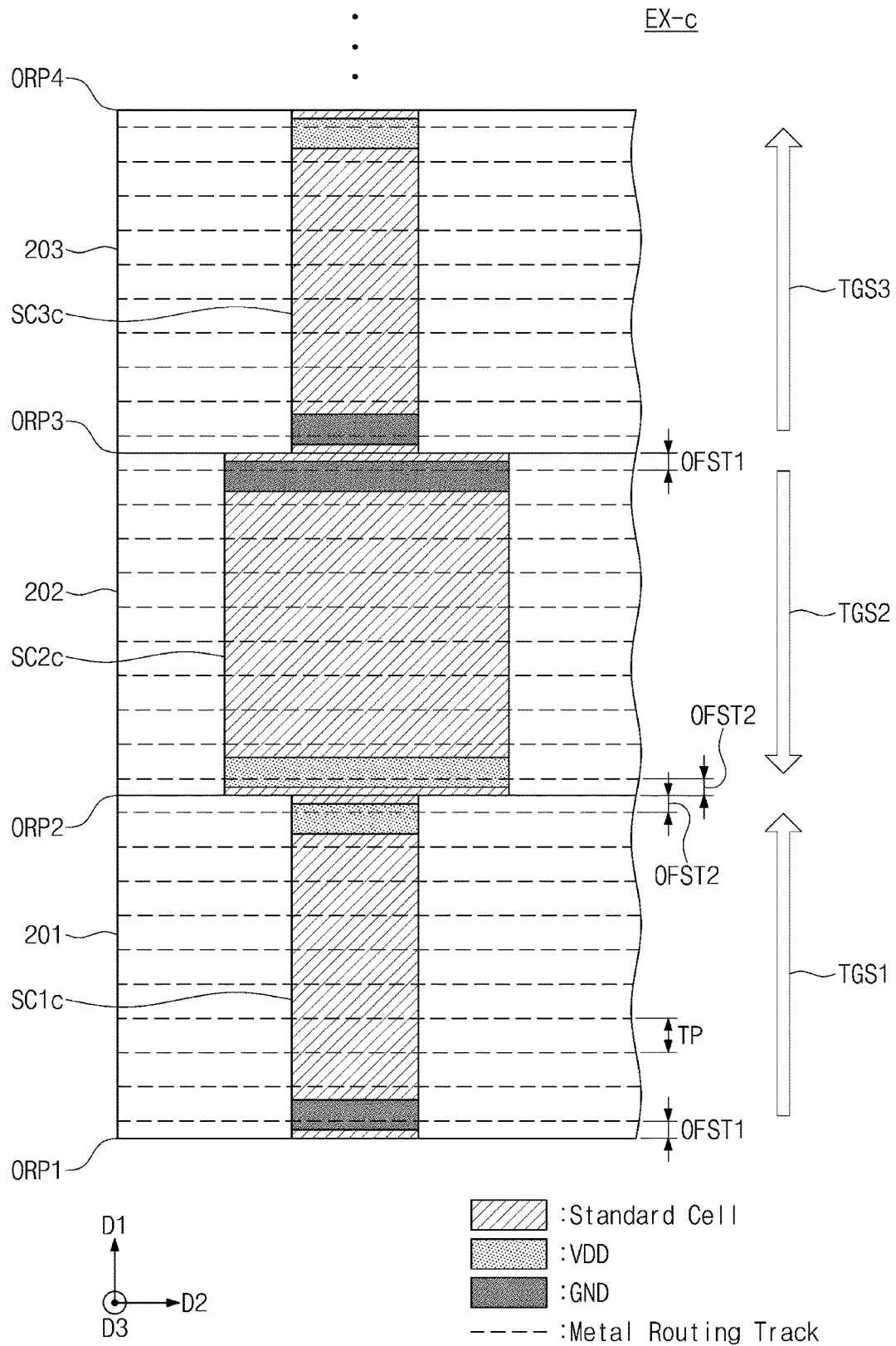
FIG. 10 is another schematic of a semiconductor device generated according to the electronic design automation method of FIG. 8.

FIG. 10 is a drawing illustrating another example of a part or functional block (Ex-c) of a semiconductor device designed according to the electronic design automation method of FIG. 8. The part (EX-c) shown FIG. 10 corresponds to the part (EX) of the semiconductor device 200 shown in FIG. 2. The part (EX-c) of the semiconductor device 200 includes standard cells (SC1c, SC2c, SC3c) and site-rows 201, 202 and 203 generated according to the methods of FIGS. 7 and 8. A size of the standard cells (SC1c, SC2c, SC3c) and a size of the site-rows 201, 202 and 203 are the same as the size of the standard cells (SC1b, SC2b, SC3b) and the size of the site-rows 201, 202 and 203, respectively.

Referring to FIG. 10, metal routing tracks of each of the site-rows 201, 202 and 203 may be designed and laid out according to the arrows (TSG1, TSG2, TSG3). For example, in the site-row 201, the metal routing tracks are generated (laid out) beginning at a location offset by a first amount OFST1 from a first origin point ORP1. In the site-row 202, the metal routing tracks are generated (laid out) beginning at a location offset by the first amount OFST1 from a third origin point ORP3. In the site-row 203, the metal routing tracks are generated (laid out) beginning at a location offset by the first amount OFST1 from the third origin point ORP3.

The standard cell SC1c is disposed such that a ground terminal GND is adjacent to the first origin point ORP1. The standard cell SC2c is disposed such that the ground terminal GND is adjacent to the third origin point ORP3. The standard cell SC3c is disposed such that the ground terminal GND is adjacent to the third origin point ORP3. That is, in adjacent site-rows, the standard cells are arranged such that the ground terminal GND and a power supply terminal VDD are disposed symmetrically to each other.

Figure 11:
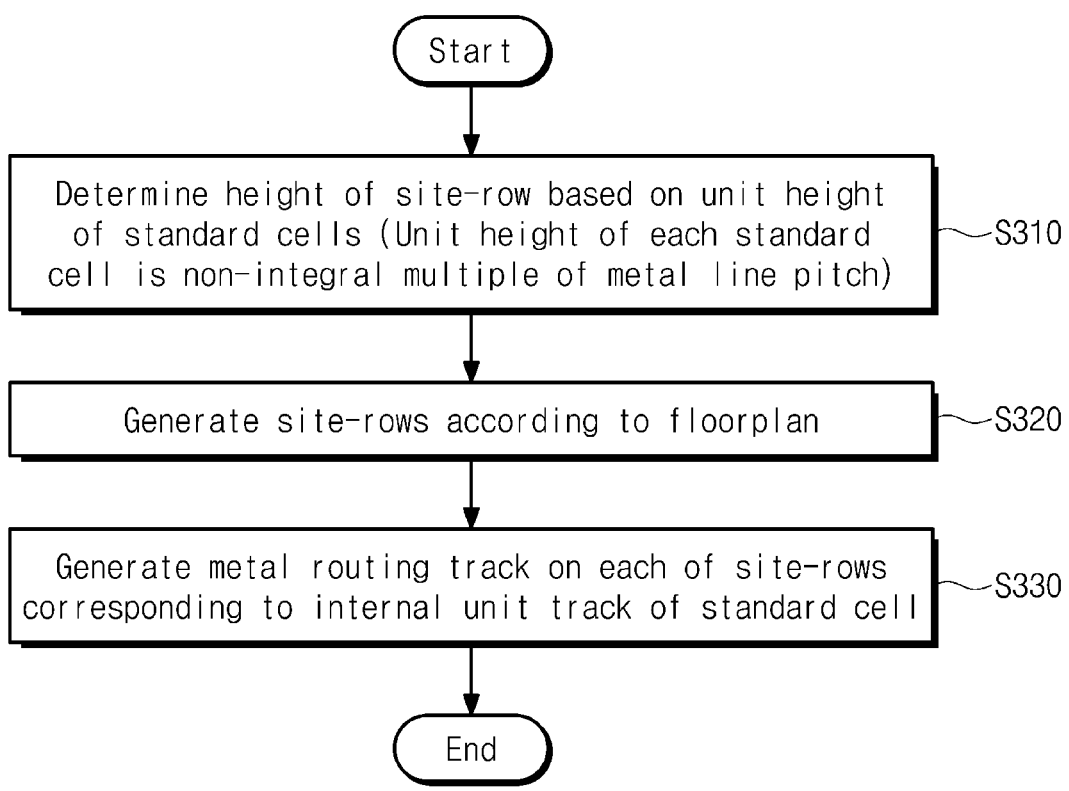
FIG. 11 is a flowchart illustrating another example of a method of generating a site-row in accordance with the inventive concept.

FIG. 11 is a flowchart illustrating examples of a method of generating a site-row and overlay of metal routing tracks in accordance with the inventive concept.

The EDA tool 132 determines a height of a site-row based on a unit height of standard cells (S310). For example, the unit height of each of the standard cells is equal to a non-integer multiple of a space between metal lines.

The EDA tool 132 generates site-rows according to a Floorplan rule (S320). For example, the EDA tool 132 generates site-rows each having a site-row height determined in the operation S310. A width of each site-row may be determined according to a space between metal lines of a layer different from the layer of metal lines that determine the unit height of the standard cells.

The EDA tool 132 may generate metal routing tracks corresponding to internal unit tracks of a standard cell on each site-row (S330). For example, starting at a location offset a specific distance from an origin point of each site-row, metal routing tracks may be generated at a pitch corresponding to that of internal unit tracks.

Figure 12:
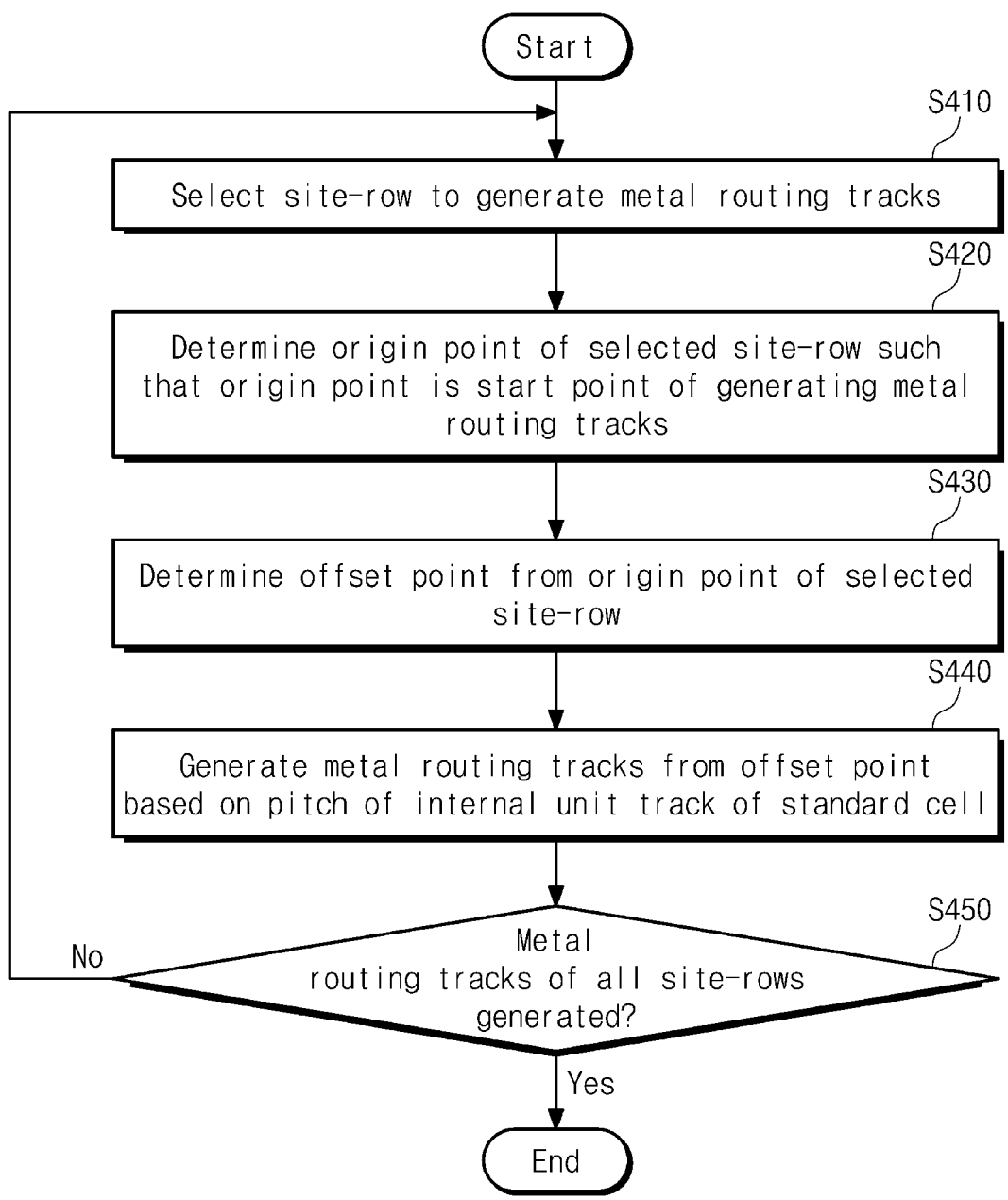
FIG. 12 is a flowchart illustrating another example of a method of generating a metal routing track in accordance with the inventive concept.

FIG. 12 is a flowchart illustrating examples of a method of generating metal routing tracks in accordance with the inventive concept.

The EDA tool 132 may select a site-row to generate metal routing tracks for (S410). For example, the Floorplan of the semiconductor device 200 may be constituted by a plurality of site-rows and the EDA tool 132 may select one of site-rows constituting the Floorplan of the semiconductor device 200.

The EDA tool 132 may determine an origin point of the selected site-row (S420). For example, the origin point is a reference point for generating metal routing tracks.

The EDA tool 132 may determine an offset point offset a specific distance from the origin point of the selected site-row (S430). For example, the offset point is a starting point for generating the metal routing tracks, i.e., is the location where a first one of the metal routing tracks is generated.

The EDA tool 132 may generate metal routing tracks which begin at the offset point and have a pitch based on a pitch of internal unit tracks of a standard cell (S440). For example, the pitch of the internal unit tracks of the standard cell may be the same as the space between metal lines whose lay out is produced by the P&R tool 133.

The EDA tool 132 can check whether metal routing tracks of all the site-rows have been generated (S450). When the metal routing tracks for all the site-rows have been generated, the EDA tool 132 finishes the Floorplan. When the metal routing tracks for all the site-rows have not been generated, the EDA tool 132 may repeatedly perform the operations S410 to S440.

Figure 13:
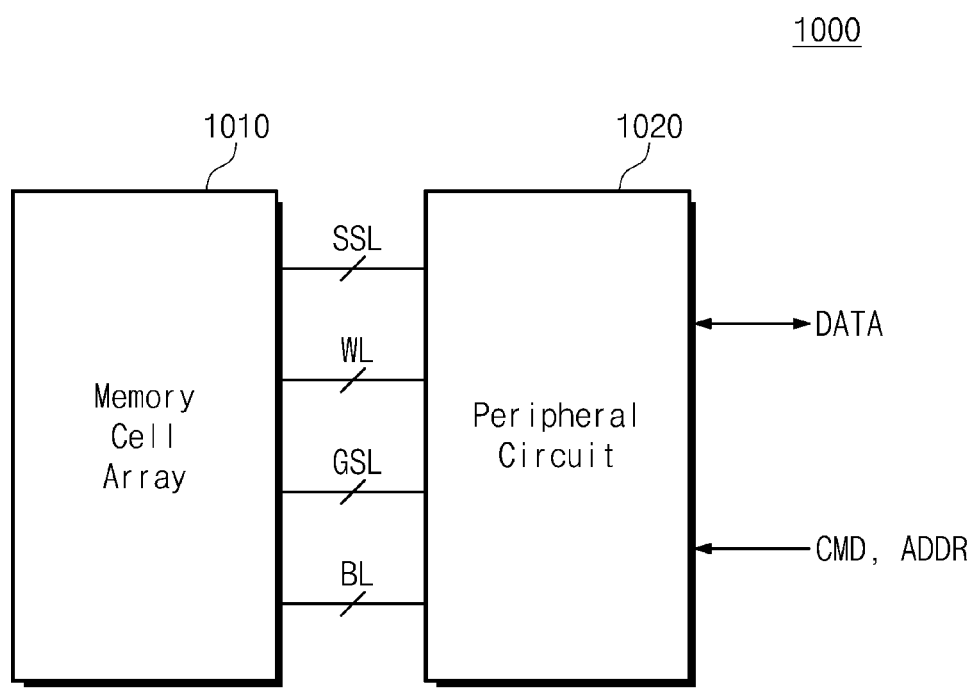
FIG. 13 is a block diagram illustrating a memory device generated by an electronic design automation method of the inventive concept.

FIG. 13 is a block diagram illustrating examples of memory devices made by an electronic design automation method of the inventive concept. Referring to FIG. 13, a memory device 1000 may include a memory cell array 1010 and a peripheral circuit 1020.

The memory cell array 1010 and the peripheral circuit 1020 may be connected to each other through string select lines SSL, word lines WL, a ground select line or ground select lines GSL, and bit lines BL. The memory cell array 1010 may include a plurality of memory blocks. Memory cells of each memory block may form a two-dimensional memory array. Alternatively, memory cells of each memory block may be stacked in a direction perpendicular to a substrate to form a three-dimensional memory array. Each memory block may include a plurality of memory cells and a plurality of select transistors.

The peripheral circuit 1020 may receive a command CMD and an address ADDR from the outside. The peripheral circuit 1020 may store data DATA received from the outside in the memory cell array 1010 according to the received command CMD and the address ADDR. The peripheral circuit 1020 may also output data DATA read from the memory cell array 1010 according to the received command CMD and the address ADDR.

The peripheral circuit 1020 may include an address decoder, a voltage generator, a read and write circuit, and control logic. The electronic design automation system 100 may design the peripheral circuit 1020 using a standard cell and a site-row having a unit height that is a non-integer multiple of a space between metal lines.

According to another aspect of the inventive concept, the peripheral circuit 1020 is fabricated by processes, known per se, and according to the design produced by the electronic design automation system 100 configured according to the inventive concept. Thus, an area of the peripheral circuit 1020 may be minimized FIG. 2 shows examples of the various components constituted by a plurality of transistors, and functional blocks that may constitute the peripheral circuit 1020. The components are formed on a substrate and thus FIG. 2 can be seen to illustrate one or more examples of a semiconductor device itself fabricated according to the inventive concept with components corresponding to various ones of the standard cells. Also, the peripheral circuit will also have layers of metal lines on the substrate. The metal lines of one of the layers will be formed to all run along the metal routing tracks of the design as shown in FIG. 9 or FIG. 10, for example, and over the components corresponding to the standard cells. Vertical contacts, formed through an interlayer insulating layer, for example, will connect the metal lines to contact points, e.g., ground and voltage terminals, at locations where the metal routing tracks and internal unit tracks coincide in the design. Thus, power may be supplied to all of the components in a row corresponding to a site-row of the design. Another layer of metal lines is formed as all running in direction D1 and connects components in different ones of the site-rows to one another. Of course, the device shown in FIG. 13 and more specifically, the peripheral circuit, is just one example of a semiconductor device which may be designed and then fabricated in conformance with such a design according to the inventive concept.

The memory cell array 1010 is connected to the address decoder through the string select lines SSL, the word lines WL, and the ground select lines GSL and is connected to the read and write circuit through the bit lines BL. The memory cell array 1010 may include a plurality of memory blocks. Each memory block may include a plurality of memory cells and a plurality of select transistors. The memory cells are connected to the word lines WL and the select transistors are connected to the string select lines SSL or the ground select lines GSL. The memory cells of each memory block may store one or more bits.

The address decoder is connected to the memory cell array 1010 through the string select lines SSL, the word lines WL, and the ground select lines GSL. The address decoder is configured to operate in response to a control of the control logic. The address decoder receives an address ADDR from the outside.

The address decoder is configured to decode a row address among the received addresses ADDR. Using the decoded row address, the address decoder selects string select lines SSL, word lines WL, and ground select lines GSL. The address decoder may receive various voltages from the voltage generator and transmit the received voltages to string select lines SSL, word lines WL, and ground select lines GSL that are selected or unselected, respectively.

The voltage generator is configured to generate various voltages required by the memory device 1000. For example, the voltage generator may generate a plurality of program voltages, a plurality of pass voltages, a plurality of select read voltages, and a plurality of unselect read voltages.

The read and write circuit may be connected to the memory cell array 1010 through the bit lines BL and exchange data DATA with the outside. The read and write circuit operates under the control of the control logic. The read and write circuit may be configured to receive a column address decoded from the address decoder. Using the decoded column address, the read and write circuit may select bit lines BL.

The read and write circuit may receive data from the outside and write the received data in the memory cell array 1010. The read and write circuit may read data from the memory cell array 1010 and transmit the read data to the outside. The read and write circuit may read data from a first storage area of the memory cell array 1010 and write the read data in a second storage area of the memory cell array 1010. For example, the read and write circuit may be configured to perform a copy-back operation.

The read and write circuit may include constituent elements such as a page buffer (or page register), a column select circuit, a data buffer, etc. As another example, the read and write circuit may include constituent elements such as a sense amplifier, a write driver, a column select circuit, a data buffer, etc.

The control logic may be connected to the address decoder, the voltage generator, and the read and write circuit. The control logic is configured to control an operation of the memory device 1000. The control logic operates in response to a command CMD transmitted from an external controller.

According to example examples of the inventive concept, using standard cells having a unit height that is a non-integer multiple of a space between metal lines and a site-row corresponding to the standard cells, a semiconductor device having a reduced area and an electronic design automation method thereof may be provided.

Although detailed examples of inventive concepts have been described, it should be understood that numerous other modifications, changes, variations, and substitutions can be devised by those skilled in the art. Moreover, it should be understood that the inventive concepts cover various techniques which can be readily modified and embodied based on the above-described examples.

What is claimed is:

1. A method of manufacturing a semiconductor device, the method comprising:
    an electronic design process of generating a layout of the semiconductor device including:
    producing a set of standard cells each comprising a two-dimensional representation of an electronic component of the semiconductor device, and wherein one of the two dimensions of each of the standard cells is standardized so that said one of the dimensions is a standardized dimension having the same value among the standard cells,
    producing site-rows disposed side-by-side and collectively corresponding to a footprint of the semiconductor device, each of the site-rows comprising a two-dimensional frame, one of the dimensions of the frame being a width of the frame and the other of the dimensions being the same as the standardized dimension,
    generating an overlay of metal routing tracks for each of the site-rows, wherein, for each of the site rows, the metal routing tracks begin at a point offset from an origin located along a width-wise side of the frame of the site-row,
    laying out the standard cells in the site-rows each as confined within the frame of a respective one of the site-rows and with the standardized dimensions of the standard cells all oriented in a first direction parallel to the standardized dimensions of the frames of the site-rows; and
    fabricating a semiconductor device conforming to the layout by forming the electronic components represented by the standard cells on a substrate, forming interconnection layers of metal lines one above another on the substrate, and connecting the metal lines to the electronic components, and
    wherein the metal lines of one of the interconnection layers extend parallel and linearly along tracks corresponding to the metal routing tracks,
    the metal lines of said one of the interconnection layers have a substantially uniform line-to-line spacing, and
    the standardized dimension is not equal to the product of any integer and the line-to-line spacing of said one of the interconnection layers.

2. The method of claim 1, wherein the forming of the interconnection layers comprise forming a stack of interconnection layers including a first interconnection layer of metal lines formed as the bottommost one of the interconnection layers, and a second interconnection layer of metal lines formed on and adjacent to the first interconnection layer in the stack, and
    said one of the interconnection layers is the second interconnection layer such that the standardized dimension is not equal to the product of any integer and the line-to-line spacing of the metal lines of the second interconnection layer.

3. The method of claim 2, wherein the metal lines of the first interconnection layer have a substantially uniform line-to-line spacing, and
    the other dimension of each of the standard cells is a respective product of an integer and the line-to-line spacing of the metal lines of the first interconnection layer.

4. The method of claim 1, wherein each of the standard cells is generated to include a representation of a ground terminal and a power supply terminal,
    for each of the site-rows, the ground terminal of each of the standard cells laid out in the site-row is overlapped by a first one of the metal routing tracks generated for the site-row, and the power supply terminal is overlapped by a second of the metal routing tracks generated for the site-row, and
    the fabricating of the semiconductor device includes forming ground and power supply terminals for each electronic component along tracks conforming to the first and second metal routing tracks of the layout, respectively.

5. The method of claim 3, wherein for adjacent site-rows of each respective pair of the site-rows, the first metal routing track of one of the site-rows is generated to be symmetrical to the second metal routing track of the other of the site-rows and the second metal routing track of said one of the site-rows is generated to be symmetrical to the first metal routing track of said other of the site-rows, about a line separating the adjacent the site rows.

6. The method of claim 1, wherein the set of standard cells is produced by a layout tool, the site-rows are produced by an electronic design automation (EDA) tool, and the standard cells are laid out in the site-rows by a place and rout (P&R) tool.

* * * * *